(12) United States Patent
Butler

(10) Patent No.: US 7,649,613 B2
(45) Date of Patent: Jan. 19, 2010

(54) LITHOGRAPHIC APPARATUS, METHOD OF CONTROLLING A COMPONENT OF A LITHOGRAPHIC APPARATUS AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 291 days.

(21) Appl. No.: 11/366,802

(22) Filed: Mar. 3, 2006

(65) Prior Publication Data

US 2007/0206169 A1   Sep. 6, 2007

(51) Int. Cl.
*G03B 27/58* (2006.01)
(52) U.S. Cl. .................... 355/72; 355/75; 318/687
(58) Field of Classification Search ................ 355/53, 355/72, 75; 318/687
See application file for complete search history.

(56) References Cited

U.S. PATENT DOCUMENTS

| | | | | |
|---|---|---|---|---|
| 4,750,721 A | * | 6/1988 | Sasada | 269/73 |
| 5,208,497 A | * | 5/1993 | Ishii et al. | 310/12 |
| 5,504,407 A | * | 4/1996 | Wakui et al. | 318/568.17 |
| 5,528,118 A | * | 6/1996 | Lee | 318/568.17 |
| 5,959,427 A | * | 9/1999 | Watson | 318/687 |
| 6,469,773 B1 | * | 10/2002 | Iwamoto | 355/53 |
| 2002/0093637 A1 | * | 7/2002 | Yuan et al. | 355/72 |
| 2004/0008331 A1 | * | 1/2004 | Cox et al. | 355/53 |
| 2004/0165172 A1 | * | 8/2004 | Poon et al. | 355/72 |
| 2004/0263846 A1 | * | 12/2004 | Kwan | 356/399 |
| 2005/0046820 A1 | * | 3/2005 | del Puerto | 355/72 |
| 2006/0279716 A1 | * | 12/2006 | Cox et al. | 355/53 |

* cited by examiner

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

A method of controlling a component within a lithographic apparatus is presented. The component is moved relative to a reference within the lithographic apparatus by a first actuator. A second actuator that exerts a force between the component and a reaction mass is used to adjust at least one of a position, velocity and acceleration of the component relative to the reference within the lithographic apparatus.

18 Claims, 3 Drawing Sheets

LITHOGRAPHIC APPARATUS, METHOD OF CONTROLLING A COMPONENT OF A LITHOGRAPHIC APPARATUS AND DEVICE MANUFACTURING METHOD

FIELD

The present invention relates to a lithographic apparatus, a method of controlling at least one of the position, velocity and acceleration of a component within a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Within a lithographic apparatus, many moving components are controlled with extremely high accuracy. For example, it is desirable in a scanner to control the position, velocity and acceleration of the support that supports the patterning device and the support that supports the substrate. The accuracy requirements are all the more stringent because the velocities and the accelerations required may be relatively high. Combined with the relatively large mass of such structures, which is desired in order to provide sufficient stiffness, the forces involved are high, with a result that it is difficult to provide an actuation system with the required accuracy. Therefore, in the presently known systems, a long-stroke stage is provided that may be moved relative to the base frame of the lithographic apparatus with the required velocity and acceleration. A short-stroke stage is mounted to the long-stroke stage and supports the substrate support or the support for the patterning device. The short-stroke stage, as its name suggests, has a limited range of movement. However, it is possible to control the accuracy of the position, velocity and/or acceleration of the substrate support or support for the patterning device to the required level of accuracy. Accordingly, the short-stroke stage is used to correct the inaccuracies that may be introduced by the long-stroke stage. These may be caused by, for example, cogging, motor force factor variations and external disturbance forces, for example caused by the vibration of other components within the lithographic apparatus and/or the connection of cables or conduits for gas supplies to the support for the substrate or patterning device.

However, in order to provide the desired accuracy, it is desirable that the short-stroke stage be able to provide relatively high accelerations. For example, a short-stroke actuator for a substrate support may need to accelerate a 20 kg substrate support up to an acceleration of 20 m/s$^2$, requiring about 400 N of force. Consequently, the short-stroke actuator is relatively bulky and requires considerable thermal conditioning in order to avoid distortion of the substrate support and other temperature sensitive components due to heating.

SUMMARY

It is desirable to provide an actuation system for a lithographic apparatus, that may for example be used for a substrate support or a support for a patterning device that may be less massive and require less thermal conditioning.

According to an embodiment of the invention, there is provided a lithographic apparatus including a component that is configured to move relative to a reference within the lithographic apparatus; a first actuator, configured to move the component relative to the reference within the lithographic apparatus; a reaction mass; a second actuator, configured to exert at least one force between the component and the reaction mass; and a controller, configured to control the second actuator such that the reaction force exerted on the component by the second actuator can adjust at least one of the position, velocity and acceleration of the component relative to the reference within the lithographic apparatus.

According to an embodiment of the invention, there is provided a method of controlling at least one of the position, velocity and acceleration of a component of a lithographic apparatus relative to a reference within the lithographic apparatus, including: using a first actuator to move the component relative to the reference within the lithographic apparatus; and using a reaction force generated by a second actuator, that is configured to exert a force between the component and a reaction mass, in order to adjust at least one of the position, velocity and acceleration of the component relative to the reference within the lithographic apparatus.

According to an embodiment of the invention, there is provided a device manufacturing method including transferring a pattern from a patterning device onto a substrate, wherein at least one of the position, velocity and acceleration of at least one of a support configured to support a patterning device and a support configured to support the substrate is controlled by the method described above.

In an embodiment of the invention, there is provided a device manufacturing method, including transferring a pattern from a patterning device onto a substrate; and controlling at least one of a position, velocity and acceleration of at least one of a support configured to support the patterning device and a support configured to support the substrate, the controlling including using a first actuator to move the at least one support relative to a reference; and using a reaction force generated by a second actuator that is configured to exert a force between the at least one support and a reaction mass, in order to adjust at least one of the position, velocity and acceleration of the at least one support relative to the reference.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
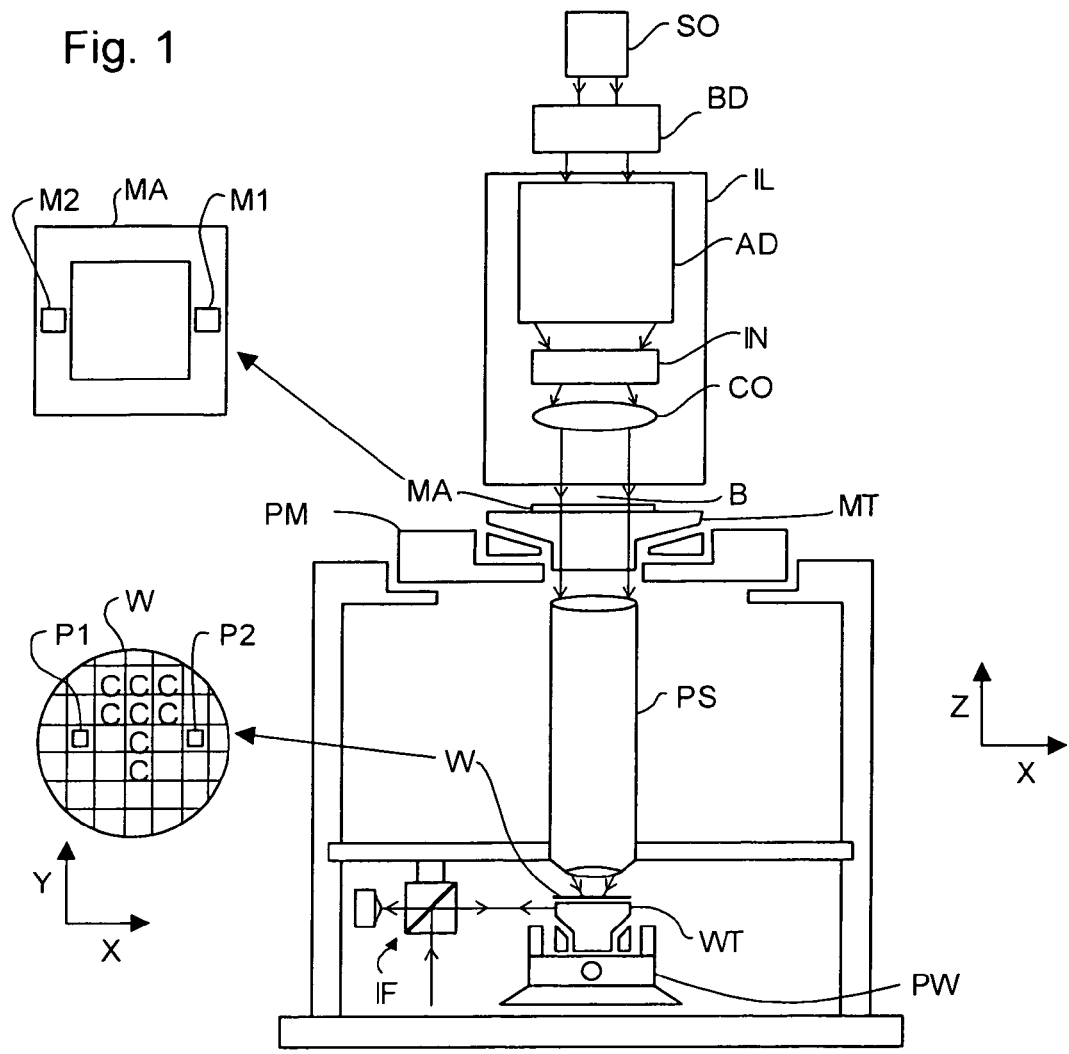
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, as disclosed below, movement of the mask table MT may be realized with the aid of a long-stroke module (coarse positioning) and, if required, a short-stroke module (fine positioning), which form part of the first positioner PM. Similarly, movement of the substrate table WT may be realized using a long-stroke module and, if required, a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
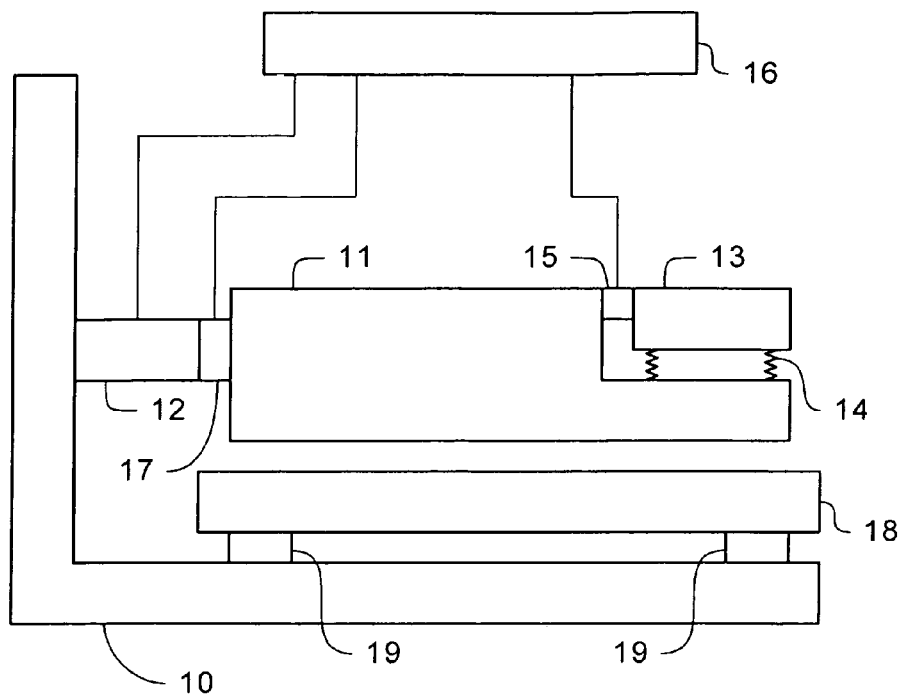
FIG. 2 depicts a portion of a lithographic apparatus according to an embodiment of the present invention.

FIG. 2 depicts an embodiment of the present invention. As depicted, the lithographic apparatus includes a base frame 10 and a movable component 11. The movable component 11 may, for example, be a substrate support or a support for a patterning device. However, it should be appreciated that the invention is not limited to this use.

As depicted, an actuator 12 moves the component 11 relative to the base frame 10. In addition, a separate frame, for example a reference metrology frame 18, may be provided and may be mounted to the base frame 10, for example, by means of low stiffness supports 19 such that the reference metrology frame 18 is dynamically isolated from the base frame 10. In such an arrangement, the position, velocity and/or acceleration of the component 11, and other components of the lithographic apparatus, may be measured and controlled relative to the reference metrology frame 18. By providing a separate reference metrology frame 18, and using the base frame 10 as a reaction frame, the accuracy of the positional control may be improved because vibrations caused by reaction forces of other components will not impact on the positional accuracy of the component 11. It should be appreciated that embodiments of the present invention is not limited to such an arrangement and that the position, velocity and/or acceleration of the component 11 may be measured directly relative to the base frame 10. Likewise, a separate reaction frame, dynamically isolated from the base frame 10 and separate from the metrology reference frame 18 may also be provided.

An actuator 12 is provided that is configured to move the component 11 relative to the reference metrology frame 18. The actuator 12 is constructed to provide a working range sufficient to move the component 11 to any required position. The actuator 12 may be constructed to control the position of the component 11 relative to the reference metrology frame 18 in a single, linear, direction. Alternatively, the actuator 12 may be constructed to adjust the position of the component 11 relative to the reference metrology frame 18 within a plane, for example independently in two orthogonal directions. As a further alternative, the actuator 12 may be constructed to adjust the position of the component 11 relative to the reference metrology frame 18 to any position within a three-dimensional space. It should further be appreciated that the actuator 12 may be constructed such that it can control the rotational position of the component 11 relative to the reference metrology frame 18 and that, in general, the actuator 12 may be constructed to adjust the position of the component 11 relative to the reference metrology frame 18 in any linear direction and rotationally about any given axis up to and including a full six degree of freedom system.

As depicted, the apparatus further includes a reaction mass 13 mounted to the component 11. As shown, the reaction mass 13 may be mounted to the component 11 by a low stiffness support 14. For example, the reaction mass 13 may be mounted with one or more springs or other resilient device. A second actuator 15 is provided and arranged to exert a force between the component 11 and the reaction mass 13. Accordingly, a corrective force may be applied to the component 11 by the actuator 15 which applies an equal and opposite reaction force to the reaction mass 13. It should be appreciated that the reaction mass 13 may be mounted directly to the component 11 by way of the actuator 15 without requiring a separate low stiffness support 14.

The second actuator 15 may be configured to provide reaction forces to the component 11 that correspond to the directions in which the first actuator 12 can adjust the position of the component 11 relative to the reference metrology frame 18. Similarly, the second actuator 15 may be constructed such that it can exert a torque on the component 11 that corresponds to the angular direction within which the first actuator 12 can control the angular position of the component 11. In general, the second actuator 15 may be constructed such that it can exert reaction forces and torques corresponding to all of the linear directions and angular directions in which the first actuator 12 can control the position of the component 11 relative to the reference metrology frame 18. However, the second actuator 15 may be constructed such that it does not exert forces or torques corresponding to some of the direction of control of the first actuator 12. This may be the case, for example, if the first actuator 12 itself is constructed to control the position of the component 11 in those directions to a sufficient accuracy. Alternatively or additionally, the second actuator 15 may be constructed such that it can exert a force or torque corresponding to directions in which the first actuator 12 is not able to control the position of the component 11. This may be the case, for example, if it is desirable to control the position of the component 11 relative to the reference metrology frame 18 in those directions to a high accuracy but the required range of movement is very small and, in particular, within the range of movement of the component 11 relative to the reference metrology frame 18 afforded by the actuator 12 but not accurately controlled by it.

As depicted in FIG. 2, a controller 16 is provided that controls the first actuator 12 in order to control the position, velocity and acceleration of the component 11 relative to the reference metrology frame 18. The controller 16 further controls the second actuator 15 in order to provide corrective forces to the component 11. Accordingly, the position, velocity and acceleration of the component 11 can be controlled approximately by the first actuator 12 which provides a required range of movement of the component 11 but the required accuracy of the position, velocity and/or acceleration of the component 11 relative to the reference metrology frame 18 is provided by the interaction of the second actuator 15 and the reaction mass 13 with the component 11. Accordingly, it is possible to provide a system having a comparable range of movement as the conventionally-known combination of a long-stroke stage and a short-stroke stage and with comparable accuracy but which is far less massive and generates far less heat to be dissipated. For example, the system may be applied to a substrate support having a mass of approximately 20 kg. In this case, the reaction mass may be, for example, 50 g, in which case the magnitude of the force that may be required to be exerted by the second actuator 15 in order to provide sufficient accuracy is 0.5 N. In comparison, the magnitude of the force that may need to be generated by the short-stroke actuator of a conventional system, as discussed above, is approximately 400 N. It will be appreciated that the force, and hence mass and heat generated by the second actuator 15 in embodiments of the present invention is significantly smaller than the short-stroke actuator of a conventional system.

It should be appreciated that, although this embodiment is described as having a single controller 16 that controls both the first actuator 12 and the second actuator 15, each actuator may be provided with a separate control system. Likewise, the functions of the controller 16 may be integrated with the remainder of the control system for the lithographic apparatus or may be provided as a separate system.

In order to control the position, velocity and/or acceleration of the component 11 relative to the reference metrology frame 18, the controller 16 determines the forces that are generated by the second actuator 15 (if appropriate, in several directions). In the arrangement of the embodiment depicted in FIG. 2, the controller determines this using a force sensor 17 that measures the force exerted on the component 11 by the first actuator 12. The controller 16 may then determine the difference between the desired force to be exerted on the component 11, in order to provide the desired acceleration that may result in the intended movement of the component 11, and the actual force as measured by the force sensor 17. The difference may then be applied using the second actuator 15 in combination with the reaction mass 13. Such an arrangement may be used, for example, to minimize the errors caused by inaccuracies of the first actuator 12 such as, for example, those caused by cogging, motor force factor variations and bandwidth limitations in the motor limiting the response speed of the generated force with respect to the desired force.

The force sensor 17 may, for example, be formed from a piezo-electric component that generates an electric signal when it is compressed. Alternatively, for example, the force sensor 17 may be formed from a strain gauge that is mounted on a coupling between the first actuator 12 and the component 11. It should be appreciated, however, that any suitable device configured to measure the force exerted on the component 11 by the first actuator 12 may be used.

In order to maintain an appropriate separation between the reaction mass 13 and the component 11 during acceleration of the component 11 by the first actuator 12, the controller 16 may determine the force required to accelerate the reaction mass 13 with the same acceleration as the component 11 using the second actuator 15. For example, this may be simply determined by multiplying the acceleration with the known mass of the reaction mass 13. Accordingly, the controller 16 may control the second actuator 15 to exert a force between the reaction mass 13 and the component 11 that corresponds to the sum of the force required to accelerate the reaction mass 13 at the same rate as the component 11 and the force required to correct the position, velocity and/or acceleration of the component 11. It should be appreciated that the force exerted by the second actuator 15 to accelerate the reaction mass 13 at substantially the same rate as the component 11 (namely at the same rate, subject to that required to effect correction of the component 11) will not affect the acceleration of the component 11 because this force will effectively be counteracted by a portion of the force exerted on the component 11 by the first actuator 12. For example, the controller 16, when determining the force required to be exerted on the component 11 by the first actuator 12 in order to provide a required acceleration, multiplies the required acceleration by the sum of the mass of the component 11 and the mass of the reaction mass 13 and the second actuator 15.

It should be appreciated that the first actuator 12 may be, for example, a combination of one or more linear motors as used, for example, in a conventional long-stroke stage of the conventional two-stroke configuration. Alternatively, the first actuator 12 may be a planar motor. In general, it should be appreciated that any actuator system may be used, provided it can adjust the position of the component 11 relative to the reference metrology frame 18 over the required range of movement of the component 11. The second actuator 15 may be, for example, a Lorentz actuator, commonly referred to as a voice coil-type actuator. However, the second actuator 15 may be any convenient form of actuator, such as a piezo-electric actuator, a reluctance actuator, a pneumatic actuator or a combination of any of the actuators discussed above. In general, it will be appreciated that the greater the accuracy of the first actuator 12, the smaller the required range of movement of the second actuator 15. The required range of the second actuator 15 may be approximately equal to the positional inaccuracies of the first actuator 12, multiplied by the ratio of the mass of the component 11 to the mass of the reaction mass 13.

It should be appreciated that although the arrangement discussed above may be used in order to eliminate the need for a short-stroke stage, for example for a substrate support or a support for a patterning device, the arrangement may be used in conjunction with a two-stage actuation system, in accordance with an embodiment of the invention. For example, the arrangement discussed above may be used as a long-stroke stage with improved accuracy, reducing the need of a short-stroke stage that is mounted to the component 11 and/or improving the possible accuracy of such a short-stroke stage. Likewise, the arrangement discussed above may be used in order to provide a short-stroke stage of improved accuracy, in which case, the component marked 10 in FIG. 2 would be the long-stroke stage.

Figure 3:
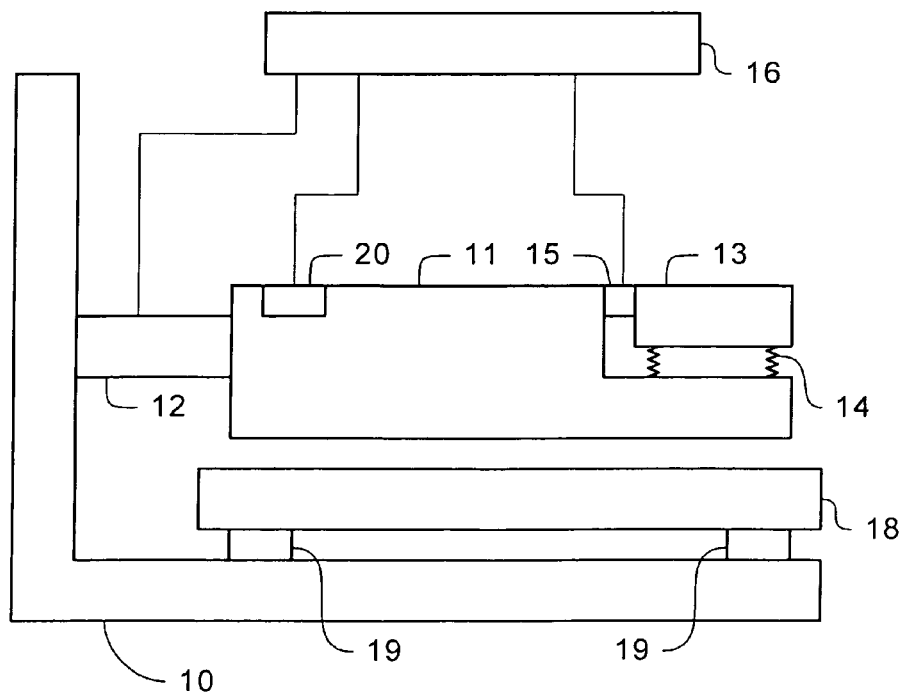
FIG. 3 depicts a portion of a lithographic apparatus according to an embodiment of the present invention.

FIG. 3 depicts an arrangement in accordance with an embodiment of the present invention. Much of the embodiment of FIG. 3 is the same as the embodiment of FIG. 2 and the description thereof will not be repeated. It should, in particular, be appreciated that the variations discussed above in relation to the embodiment of FIG. 2 may also apply equally to the embodiment of FIG. 3.

The difference between the embodiment of FIG. 2 and the embodiment of FIG. 3 is that the force sensor 17 of FIG. 2 has been replaced with an accelerometer 20 mounted to the component 11. It should be appreciated that a combined arrangement may be provided, utilizing both the force sensor 17 of FIG. 2 and the accelerometer 20 of FIG. 3.

In the embodiment of FIG. 3, the controller 16 determines the corrected force that is to be applied to the component 11 by the second actuator 15 from the output of the accelerometer 20. In particular, the controller 16 may use the measurement of the acceleration of the component 11 and the known mass of the component 11 in order to determine the actual forces exerted on the component 11. Accordingly, the controller 16 can determine the difference between the actual forces exerted on the component 11 and those that were intended to be applied to the component 11 by the first actuator 12. Subsequently, in the manner as described above in relation to the embodiment of FIG. 2, the controller 16 may use the second actuator 15 to exert the desired correction force. Such an arrangement may compensate for errors introduced by the inaccuracy of the first actuator 12 as discussed above and, in addition, external forces that may be exerted on the component 11 such as vibrations from other components of the lithographic apparatus transmitted to the component 11 and/or forces that may be exerted on the component 11 as it moves by, for example, cables or conduits for gas supplies that are connected to the component 11.

Alternatively, the controller 16 may compare the acceleration of the component 11 measured by the accelerometer 20 directly with a desired acceleration profile for the component 11. The difference between the desired acceleration and the actual acceleration may then be used to determine a force to be exerted by the second actuator 15 in order to minimize the acceleration difference.

Any conventional accelerometer having the required accuracy may be used. For example, the accelerometer may be formed from a small mass mounted on a piezo-electric element.

Figure 4:
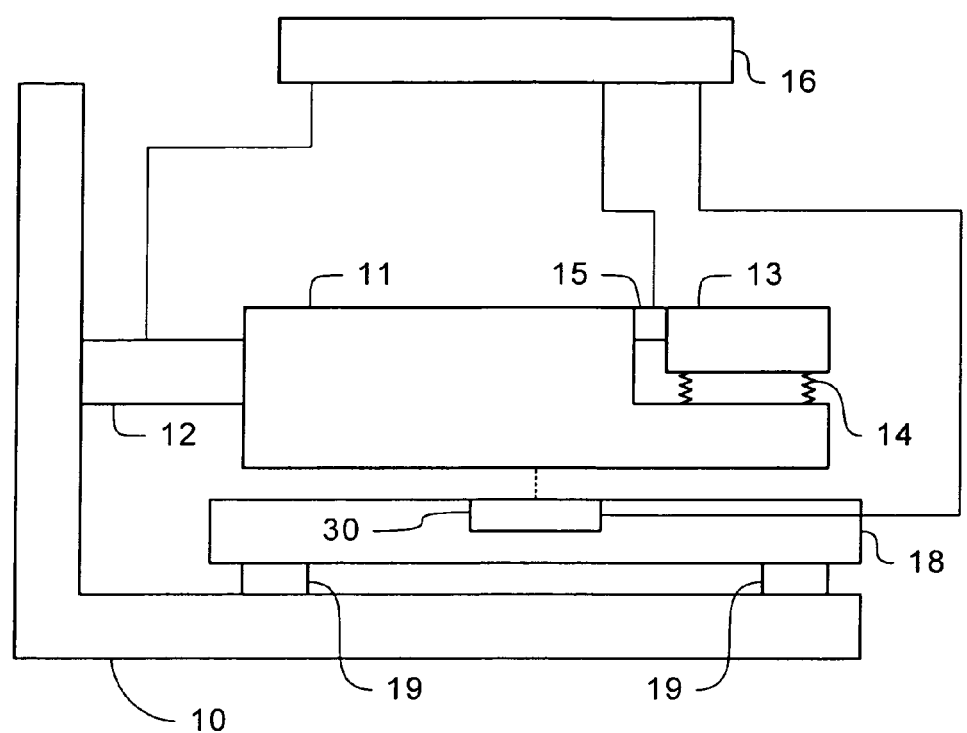
FIG. 4 depicts a portion of a lithographic apparatus according to an embodiment of the present invention.

FIG. 4 depicts an arrangement according to an embodiment of the present invention. As with the embodiment of FIG. 3, much of the embodiment of FIG. 4 corresponds to the embodiment of FIG. 2 and only the differences are discussed. Again, variations applicable to the first and second embodiments are also applicable to the third embodiment.

In the embodiment of FIG. 4, the force sensor 17 of the embodiment of FIG. 2 and the accelerometer 20 of the embodiment of FIG. 3 are replaced by a position sensor 30. However, it should be appreciated that a combined arrangement may be used in which a position sensor 30 according to the embodiment of FIG. 4 is used in combination with one or both of the force sensor 17 of the embodiment of FIG. 2 and the accelerometer 20 of the embodiment of FIG. 3.

The position sensor 30 is configured to measure one or both of the position and displacement of the component 11 relative to the reference metrology frame 18. For example, the sensor 30 may be an interferometer or an encoder. By continuously monitoring the position and/or displacement of the component 11 relative to the base frame 10, the controller 16 may determine the actual acceleration of the component 11. Accordingly, as with the embodiment of FIG. 3, the controller 16 may thus determine the force to be exerted on the component 11 by the second actuator 15 either directly from the difference between the desired acceleration and the measured acceleration of the component 11 or from the difference between the desired force to be exerted on the component 11 and the actual force deduced from the measured acceleration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a component that is configured to move relative to a reference frame within the lithographic apparatus;
a first actuator configured to exert a force on the component so as to move the component to a desired position relative to said reference frame within the lithographic apparatus;
a reaction mass mounted to the component;
a second actuator located between the component and the reaction mass such that the second actuator is configured to exert a force between the component and the reaction mass; and
a controller configured to control the second actuator such that a reaction force exerted on the component by the second actuator can adjust at least one of a position, velocity or acceleration of the component relative to said reference within the lithographic apparatus,
wherein the controller is configured to determine a difference between a force intended to be applied to the component by the first actuator and an actual force applied to the component by the first actuator; and to control the second actuator such that the reaction force exerted on the component corresponds to said difference.

2. A lithographic apparatus according to claim 1, wherein the lithographic apparatus comprises a force sensor configured to measure the force applied to the component by the first actuator; and the controller is configured to use the output from the force sensor to determine said difference.

3. A lithographic apparatus according to claim 1, wherein the lithographic apparatus comprises an accelerometer configured to measure the acceleration of the component; and the controller is configured to determine the actual force applied to the component using an output of the accelerometer and to determine said difference based on said actual force.

4. A lithographic apparatus according to claim 1, wherein the lithographic apparatus comprises a measurement system configured to measure at least one of the position or velocity of the component; and the controller is configured to use the output of the measurement system to determine the acceleration of the component, the actual force applied to the component and said difference.

5. A lithographic apparatus according to claim 1, wherein the controller is configured to determine a difference between at least one of an intended position, velocity or acceleration of the component and an actual position, velocity or acceleration of the component, respectively, and to control the second actuator in order to reduce said difference.

6. A lithographic apparatus according to claim 5, wherein the lithographic apparatus comprises at least one of an accelerometer configured to measure the acceleration of the component and a measurement system configured to measure at least one of the position or velocity of the component; and wherein the controller is configured to use an output of said at least one of the accelerometer or the measurement system to determine said difference.

7. A lithographic apparatus according to claim 1, wherein the reaction mass is mounted to the component by a low-stiffness support.

8. A lithographic apparatus according to claim 1, wherein the second actuator is at least one of a Lorentz force actuator, a piezo-electric actuator, a reluctance actuator and a pneumatic actuator.

9. A lithographic apparatus according to claim 1, wherein the second actuator is configured to exert forces between the component and the reaction mass in two or three orthogonal directions.

10. A lithographic apparatus according to claim 1, wherein the second actuator is configured to exert forces between the component and the reaction mass such that at least one torque is generated between the component and the reaction mass.

11. A lithographic apparatus according to claim 10, wherein the second actuator is configured to exert forces between the component and the reaction mass such that said at least one of the position, velocity or acceleration of the component relative to the reference within the lithographic apparatus can be controlled in six degrees of freedom.

12. A lithographic apparatus according to claim 1, wherein the controller is configured to determine (a) an adjusting force to be applied to the component in order to adjust said at least one of the position, velocity or acceleration of the component relative to said reference within the lithographic apparatus, and (b) an accelerating force required to provide the reaction mass with the same overall acceleration as the component; and wherein the controller is configured to control the second actuator such that the force exerted between the component and the reaction mass is a sum of said adjusting force and said accelerating force.

13. A lithographic apparatus according to claim 1, wherein the controller is configured to control the first actuator; and wherein the controller is configured to determine a force to be applied to the component by the first actuator by multiplying the acceleration of the component with a sum of the masses of the component, the second actuator and the reaction mass.

14. A lithographic apparatus according to claim 1, wherein said reference frame within the lithographic apparatus is a reference metrology frame, and the first actuator is configured to exert a force between a reaction frame which is different from the reference metrology frame and the component in order to move the component relative to said reference metrology frame.

15. A method of controlling at least one of a position, velocity and acceleration of a component of a lithographic apparatus relative to a reference frame within said lithographic apparatus, the method comprising:
exerting a force on the component using a first actuator to move the component to a desired position relative to said reference frame within the lithographic apparatus;
exerting a reaction force on the component using a second actuator the second actuator being located between the component and a reaction mass such that the second actuator is configured to exert the reaction force between the component and the reaction mass, in order to adjust at least one of a position, velocity and acceleration of the component relative to said reference frame within the lithographic apparatus, wherein the reaction mass is mounted to the component;
determining a difference between a force intended to be applied to the component by the first actuator and an actual force applied to the component by the first actuator; and
controlling the second actuator such that the reaction force exerted on the component corresponds to said difference.

16. A device manufacturing method, comprising:
transferring a pattern from a patterning device onto a substrate; and
controlling at least one of a position, velocity and acceleration of at least one of a support configured to support the patterning device and a support configured to support the substrate, said controlling including
exerting a force on the at least one support using a first actuator to move said at least one support to a desired position relative to a reference frame; and exerting a reaction force on the at least one support using a second actuator, the second actuator being located between the at least one support and a reaction mass such that the second actuator is configured to exert the reaction force between said at least one support and the reaction mass, in order to adjust at least one of the position, velocity or acceleration of said at least one support relative to said reference frame, wherein the reaction mass is mounted to the at least one support;

determining a difference between a force intended to be applied to the at least one support by the first actuator and an actual force applied to the at least one support by the first actuator; and controlling the second actuator such that the reaction force exerted on the at least one support corresponds to said difference.

17. A lithographic apparatus comprising:

a component that is configured to move relative to a reference frame within the lithographic apparatus;

a first actuator configured to exert a force on the component so as to move the component to a desired position relative to said reference frame within the lithographic apparatus;

a reaction mass, wherein the component is configured to support the reaction mass;

a second actuator located between the component and the reaction mass such that the second actuator is configured to exert a force between the component and the reaction mass; and a controller configured to control the second actuator such that a reaction force exerted on the component by the second actuator can adjust at least one of a position, velocity or acceleration of the component relative to said reference within the lithographic apparatus.

18. A lithographic according to claim 17, wherein the component is a substrate table configured to hold a substrate or a patterning device support configured to support a patterning device, the patterning device configured to pattern a beam of radiation.

* * * * *